(12) United States Patent
Jung

(10) Patent No.: US 10,157,658 B2
(45) Date of Patent: Dec. 18, 2018

(54) REFRESH CONTROL DEVICE

(71) Applicant: SK hynix Inc., Icheon-si, Gyeonggi-do (KR)

(72) Inventor: Chul Moon Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 10 days.

(21) Appl. No.: 15/451,813

(22) Filed: Mar. 7, 2017

(65) Prior Publication Data

US 2018/0082736 A1  Mar. 22, 2018

(30) Foreign Application Priority Data

Sep. 21, 2016 (KR) ........................ 10-2016-0120828

(51) Int. Cl.
*G11C 11/406* (2006.01)
*G11C 11/408* (2006.01)

(52) U.S. Cl.
CPC ... G11C 11/40611 (2013.01); G11C 11/40626 (2013.01); *G11C 11/408* (2013.01)

(58) Field of Classification Search
CPC .................... G11C 11/40611; G11C 11/40626
See application file for complete search history.

(56) References Cited

U.S. PATENT DOCUMENTS

| | | | | |
|---|---|---|---|---|
| 5,999,472 A | * | 12/1999 | Sakurai | ............. G11C 11/40618 365/222 |
| 8,923,084 B1 | * | 12/2014 | Song | ................... G11C 11/4063 365/222 |
| 9,349,430 B2 | | 5/2016 | Hyun et al. | |
| 9,620,195 B1 | * | 4/2017 | Hyun | .................. G11C 11/4074 |
| 2010/0182862 A1 | * | 7/2010 | Teramoto | ................. G11C 7/04 365/222 |
| 2015/0049566 A1 | * | 2/2015 | Lee | .......................... G11C 7/02 365/222 |
| 2015/0085564 A1 | * | 3/2015 | Yoon | ................. G11C 11/40611 365/149 |
| 2015/0170728 A1 | * | 6/2015 | Jung | ........................ G11C 8/08 365/222 |
| 2016/0019944 A1 | * | 1/2016 | Jung | ...................... G11C 29/76 365/200 |
| 2016/0125931 A1 | * | 5/2016 | Doo | ................. G11C 11/40626 365/222 |
| 2016/0329089 A1 | * | 11/2016 | Lim | ....................... G11C 11/406 |
| 2017/0140811 A1 | * | 5/2017 | Joo | .................... G11C 11/40603 |
| 2017/0178715 A1 | * | 6/2017 | Lee | .................... G11C 11/40618 |
| 2017/0372767 A1 | * | 12/2017 | Kang | .................... G11C 11/406 |

* cited by examiner

*Primary Examiner* — Khamdan N. Alrobaie
(74) *Attorney, Agent, or Firm* — William Park & Associates Ltd.

(57) ABSTRACT

A refresh control device for reducing power consumption during a target row refresh operation is disclosed. The refresh control device includes a refresh address generator configured to generate a refresh address by selecting any one of a target row refresh address and a normal refresh address according to a target row refresh flag signal, an address control signal generator configured to generate a multiple address control signal in response to the target row refresh flag signal and a multiple refresh signal, and a final refresh address generator configured to generate a plurality of final refresh addresses from the refresh address in response to the multiple address control signal.

20 Claims, 7 Drawing Sheets

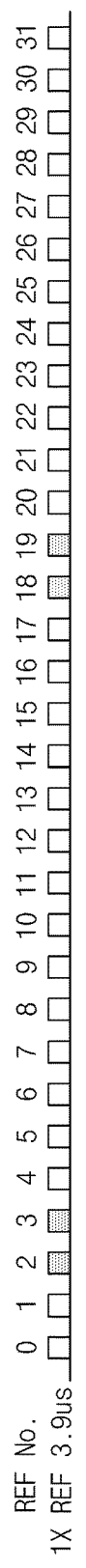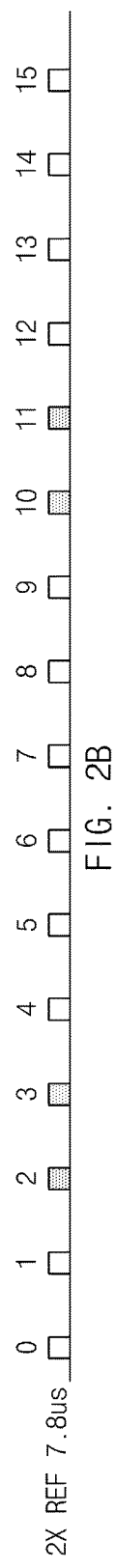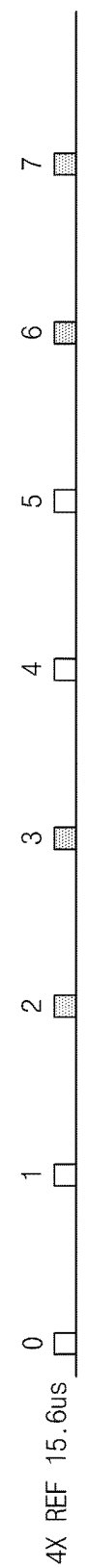

REFRESH CONTROL DEVICE

CROSS-REFERENCE TO RELATED APPLICATION

This application claims priority based upon Korean patent application No. 10-2016-0120828, filed on Sep. 21, 2016, the disclosure of which is hereby incorporated in its entirety by reference herein.

BACKGROUND OF THE INVENTION

1. Technical Field

Embodiments of the present disclosure relate to a technology for controlling a refresh operation to prevent deterioration of memory cells.

2. Related Art

In a semiconductor device, a memory cell for storing data within the semiconductor device is implemented as a capacitor. Therefore, if a specific word line is selected, a transistor connected to the specific word line is turned on, such that a potential of a cell corresponding to the above word line is output to a bit line.

The potential of the memory cell is gradually reduced. In other words, a capacitor used for a memory cell of the semiconductor device gradually discharges electric charges stored within the capacitor according to lapse of time, such that data is lost. The capacitor is unsuitable for memory devices used to read and write data. Therefore, to guarantee reliability of data, all devices designed to use the semiconductor device must perform refresh operations to recover electric charges of the memory cells.

BRIEF SUMMARY OF THE INVENTION

Various embodiments of the present disclosure are directed to providing a refresh control device that substantially obviates one or more problems due to limitations and disadvantages of the related art.

The embodiment of the present disclosure relates to a refresh control device configured to reduce power during a refresh operation (target row refresh) to be performed on a specific row (word line).

In accordance with an embodiment of the present disclosure, a refresh control device includes: a refresh address generator configured to generate a refresh address by selecting any one of a target row refresh address and a normal refresh address according to a target row refresh flag signal; an address control signal generator configured to generate a multiple address control signal in response to the target row refresh flag signal and a multiple refresh signal; and a final refresh address generator configured to generate a plurality of final refresh addresses from the refresh address in response to the multiple address control signal.

In accordance with another embodiment of the present disclosure, a refresh control device includes: a target row refresh flag generator configured to generate the target row refresh flag signal based on temperature information and an auto refresh signal; a normal refresh address generator configured to generate a normal refresh address based on the auto refresh signal and the target row refresh flag signal; and a refresh address generator configured to generate a refresh address by selecting any one of a target row refresh address and the normal refresh address according to the target row refresh flag signal.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The above and other features and advantages of the present disclosure will become readily apparent by reference to the following detailed description when considered in conjunction with the accompanying drawings wherein:

FIGS. 2A to 2C are timing diagrams illustrating a representation of an example of a normal refresh operation and a target row refresh operation performed by the refresh control device shown in FIG. 1.

DESCRIPTION OF EMBODIMENTS

Reference will now be made in detail to the embodiments of the present disclosure, examples of which are illustrated in the accompanying drawings. Wherever possible, the same reference numbers will be used throughout the drawings to refer to the same or like parts.

Figure 1:
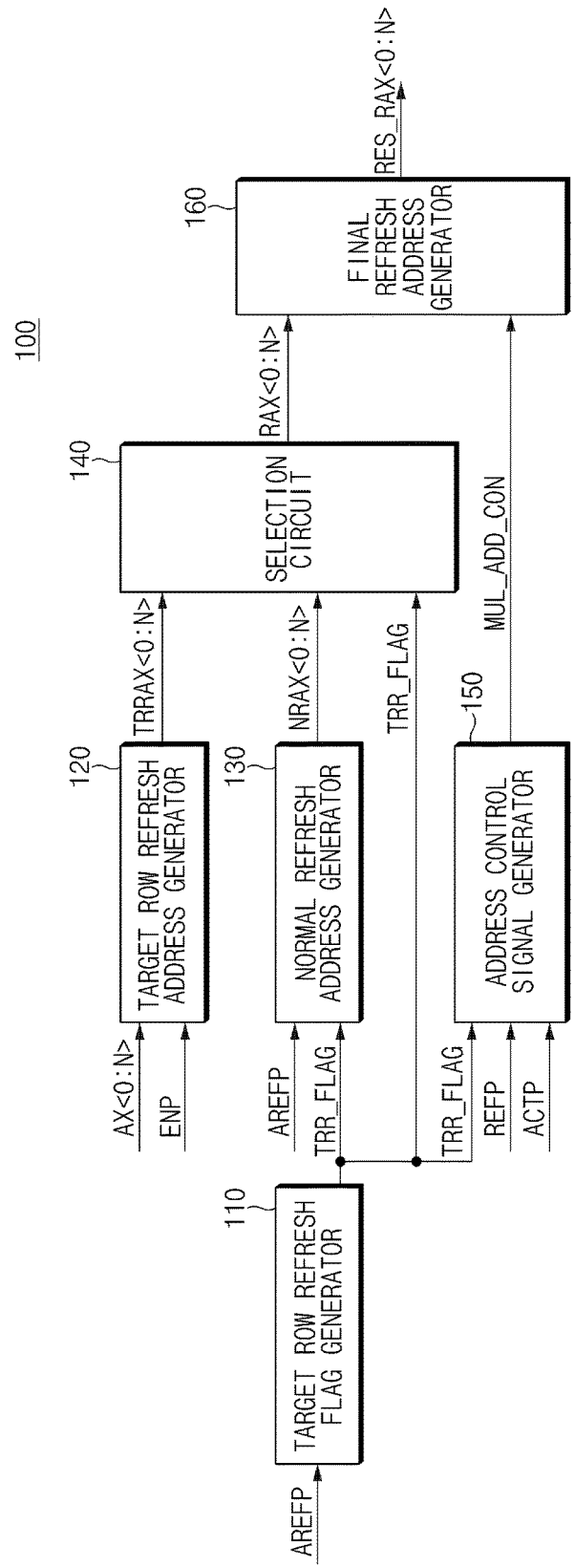
FIG. 1 is a block diagram illustrating a representation of an example of a refresh control device according to an embodiment of the present disclosure.

FIG. 1 is a block diagram illustrating a representation of an example of a refresh control device 100 according to an embodiment of the present disclosure.

Referring to FIG. 1, the refresh control device 100 may include a target row refresh flag generator 110, a target row refresh address generator 120, a normal refresh address generator 130, a refresh address generator 140 (hereinafter referred to as a selection circuit), an address control signal generator 150, and a final refresh address generator 160.

The target row refresh flag generator 110 may generate a target row refresh flag signal TRR_FLAG based on an auto refresh signal AREFP. The auto refresh signal AREFP may be received from an external part. The auto refresh signal AREFP may be received from a memory controller. The auto refresh signal AREFP may be generated to have a different period based on an external input signal received from the external part at predetermined time intervals.

The target row refresh flag generator 110 may be implemented as a counter. The target row refresh flag generator 110 may count the number of auto refresh signals AREFP, and may enable a target row refresh flag signal TRR_FLAG whenever a count of the auto refresh signal AREFP reaches a predetermined value.

FIGS. 2(a) to 2(c) are timing diagrams illustrating a representation of an example of a normal refresh operation and a target row refresh operation performed by the refresh control device 100 shown in FIG. 1.

FIG. 2(a) illustrates an example in which the auto refresh signal AREFP is input at predetermined time intervals of 3.9 μs.

Referring to FIG. 2A, the target row refresh flag signal TRR_FLAG is enabled when the auto refresh signal AREFP is any one of second and third auto refresh signals and is any one of $18^{th}$ and $19^{th}$ auto refresh signals. That is, the target row refresh flag signal TRR_FLAG may begin from an occurrence of the second auto refresh signal AREFP, and may then be enabled twice whenever the auto refresh signal AREFP occurs more than 16 times after occurrence of the second auto refresh signal AREFP.

FIG. 2B illustrates an example in which the auto refresh signal AREFP is input at intervals of a predetermined time 7.8 μs.

Referring to FIG. 2B, the target row refresh flag signal TRR_FLAG is enabled when the auto refresh signal AREFP is any of second and third auto refresh signals and is any of tenth and eleventh auto refresh signals. That is, the target row refresh flag signal TRR_FLAG may begin from an occurrence of the second auto refresh signal AREFP, and may then be enabled twice whenever the auto refresh signal AREFP occurs more than 8 times after an occurrence of the second auto refresh signal AREFP.

FIG. 2C illustrates an example in which the auto refresh signal AREFP is input at intervals of a predetermined time 15.6 μs.

Referring to FIG. 2C, the target row refresh flag signal TRR_FLAG is enabled when the auto refresh signal AREFP is any of second and third auto refresh signals and is any of sixth and seventh auto refresh signals. That is, the target row refresh flag signal TRR_FLAG may begin from an occurrence of the second auto refresh signal AREFP, and may then be enabled twice whenever the auto refresh signal AREFP occurs more than 4 times after an occurrence of the second auto refresh signal AREFP.

FIGS. 2A to 2C assume that input auto refresh signals are different from one another. However, the auto refresh signal AREF applied to the refresh control device 100 may have a predetermined period, and may occur to have a different period based on the auto refresh signal AREFP. For example, the auto refresh signal AREFP is enabled at intervals of a predetermined time 3.9 μs as shown in FIG. 2A, the signal illustrated in FIG. 2B is enabled whenever the auto refresh signal AREFP occurs 2n times (n=0, 1, 2, ... ), and the other signal illustrated in FIG. 2C is enabled whenever the auto refresh signal AREFP occurs 4n times (n=0, 1, 2, ... ), such that the target row refresh flag generator 110 may operate based on the above two signals and the target row refresh flag signal TRR_FLAG can be enabled.

Referring back to FIG. 1, the target row refresh address generator 120 may generate the target row refresh addresses TRRAX<0:N> based on an address enable signal ENP and the row addresses AX<0:N>. The address enable signal ENP may indicate that the row addresses AX<0:N> are target row refresh objects.

The target row refresh address generator 120 may be implemented as a latch. If the address enable signal ENP is enabled, the target row refresh address generator 120 may output the row addresses AX<0:N> as the target row refresh addresses TRRAX<0:N>.

In an embodiment, the target row refresh addresses TRRAX<0:N> may be, for example, addresses of word lines, each of which has a data retention time reduced by row hammering.

If a specific word line is activated or deactivated, a voltage of a contiguous word line increases or decreases due to a coupling phenomenon generated between a specific word line and the contiguous word line neighboring with the specific word line, such that the amount of charge of a cell capacitor coupled to the contiguous word line is greatly affected by the increasing or decreasing voltage of the contiguous word line. Therefore, if activation of a specific word line frequently occurs and the specific word line toggles from an active state to an inactive state and from the inactive state to the active state, the amount of charge stored in the cell capacitor contained in a memory cell coupled to the contiguous word line is changed, such that data of the memory cell may be damaged or deteriorated.

Electromagnetic waves generated when a word line is toggled between the active state and the inactive state may allow electrons to be introduced into a cell capacitor of the memory cell coupled to a word line contiguous with the toggled word line or may allow electrons to be discharged from the cell capacitor, such that data is damaged or lost.

The above-mentioned phenomenon in which data of a memory cell coupled to the corresponding word line or to contiguous word lines is damaged or lost due to a large number of activation times is referred to as a row hammering phenomenon or a word line disturbance phenomenon.

In order to prevent an occurrence of the row hammering phenomenon, the number of activation times of each word line is counted, not only the row addresses AX<0:N> of a word line (target row) activated at least a predetermined number of times, but also the address enable signal ENP may be sent to the target row refresh address generator 120.

However, the scope and spirit of the present disclosure is not limited thereto, and the row addresses AX<0:N> may be addresses of the word lines which need to be additionally refreshed by other reasons excepting the row hammering.

The normal refresh address generator 130 may generate normal refresh addresses NRAX<0:N> based on not only the auto refresh signal AREFP but also the target row refresh flag signal TRR_FLAG generated by the target row refresh flag generator 110.

The normal refresh address generator 130 may be implemented by a counter. The normal refresh address generator 130 may increase a counted value (hereinafter referred to as a counter value) of the counter whenever the auto refresh signal AREFP is enabled. The normal refresh address generator 130 may output a value corresponding to the increased counter value as the normal refresh address NRAX<0:N>.

In this case, if the target row refresh flag signal TRR_FLAG is enabled, the normal refresh address generator 130 may hold the counter value of auto refresh signals AREFP without increasing the counter value. If the target row refresh flag signal TRR_FLAG is disabled, the normal refresh address generator 130 may increase the counter value.

Referring back to FIG. 2A, when the auto refresh signal AREFP is input at intervals of a predetermined time 3.9 μs, the normal refresh address generator 130 may sequentially increase the counter value from 0 to 1. The normal refresh address generator 130 may generate the normal refresh addresses NRAX<0:N> corresponding to the counter values 0 to 1.

Subsequently, when the second and third auto refresh signals AREFP are input into the normal refresh address generator 130, the target row refresh flag signal TRR_FLAG may be enabled. Therefore, the normal refresh address generator 130 may not increase the counter value.

Thereafter, if the fourth to $17^{th}$ auto refresh signals AREFP are input into the normal refresh address generator 130, the target row refresh flag signal may be disabled. Accordingly, the normal refresh address generator 130 may sequentially increase the counter value. The normal refresh address generator 130 may generate the normal refresh addresses NRAX<0:N> corresponding to the counter values 2 to 15.

If the $18^{th}$ and $19^{th}$ auto refresh signals AREFP are input into the normal refresh address generator 130, the target row refresh flag signal TRR_FLAG may be enabled. As a result, the normal refresh address generator 130 may not increase the counter value.

If the $20^{th}$ to $31^{st}$ auto refresh signals AREFP are input into the normal refresh address generator 130, the target row refresh flag signal TRR_FLAG may be disabled. Therefore, the normal refresh address generator 130 may sequentially increase the counter value. The normal refresh address generator 130 may generate the normal refresh addresses NRAX<0:N> corresponding to the counter values 16 to 27.

The input auto refresh signals AREFP illustrated in FIGS. 2B and 2C may have different periods, and the normal refresh address generator 130 illustrated in FIGS. 2B and 2C may operate in the same manner as in FIG. 2A.

The selection circuit 140 may select any one of the target row refresh addresses TRRAX<0:N> and the normal refresh addresses NRAX<0:N> based on the target row refresh flag signal TRR_FLAG, and may output the selected one as the refresh addresses RAX<0:N>. For example, the selection circuit 140 may output at least one of the target row refresh addresses TRRAX<0:N> as at least one of the refresh addresses RAX<0:N> when the target row refresh flag signal TRR_FLAG is enabled, or the selection circuit 140 may output at least one of the normal refresh addresses NRAX<0:N> as at least one of the refresh addresses RAX<0:N> when the target row refresh flag signal TRR_FLAG is disabled. In one example, the selection circuit 140 may be implemented as a multiplexer.

Referring to FIG. 2A, when the $0^{th}$ auto refresh signal AREFP, the first auto refresh signal AREFP, the fourth to $17^{th}$ auto refresh signals AREFP, and the $20^{th}$ to $31^{st}$ auto refresh signals AREFP are input, the target row refresh flag signal TRR_FLAG may be disabled. Accordingly, the selection circuit 140 may output the normal refresh addresses NRAX<0:N>.

When the second auto refresh signal AREFP, the third auto refresh signal AREFP, the $18^{th}$ auto refresh signal AREFP, and the $19^{th}$ auto refresh signal AREFP are input, the target row refresh flag signal TRR_FLAG may be enabled. Therefore, the selection circuit 140 may output the target row refresh addresses TRRAX<0:N>.

The input auto refresh signals AREFP illustrated in FIGS. 2B and 2C may have different periods, and the selection circuit 140 illustrated in FIGS. 2B and 2C may operate in the same manner as in FIG. 2A.

The address control signal generator 150 may enable and generate a multiple address control signal MUL_ADD_CON on the basis of at least one of the target row refresh flag signal TRR_FLAG, an active signal ACTP, and a multiple refresh signal REFP.

In more detail, if the multiple refresh signal REFP is enabled, the address control signal generator 150 may enable the multiple address control signal MUL_ADD_CON. The multiple address control signal MUL_ADD_CON may be input to the final refresh address generator 160 in such a manner that a plurality of word lines may be simultaneously refreshed.

If the active signal ACTP is enabled, the address control signal generator 150 may disable the multiple address control signal MUL_ADD_CON. The active signal ACTP may be input as enabled for a read operation or a write operation.

If the target row refresh flag signal TRR_FLAG is enabled, the address control signal generator 150 may disable the multiple address control signal MUL_ADD_CON. Accordingly, the final refresh address generator 160 may refresh only one word line.

Figure 3:
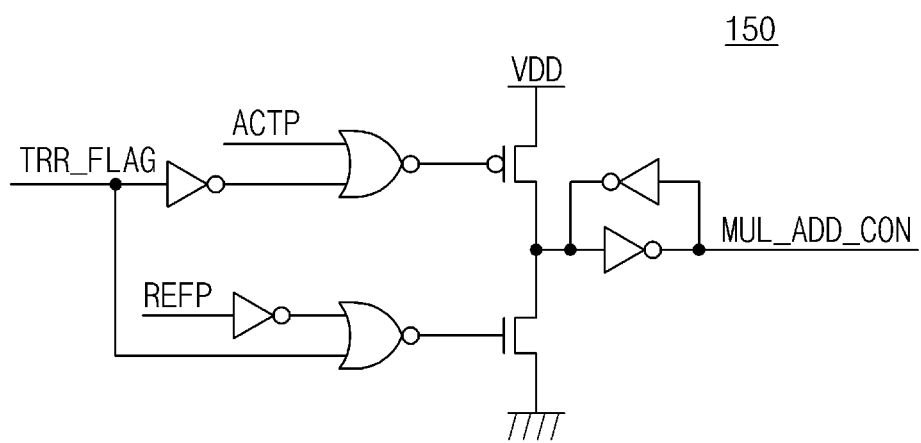
FIG. 3 is a detailed circuit diagram illustrating a representation of an example of an address control signal generator shown in FIG. 1.

FIG. 3 is a detailed circuit diagram illustrating a representation of an example of the address control signal generator 150 shown in FIG. 1.

Referring to FIG. 3, if the active signal ACTP is enabled and the address control signal generator 150 is pulled up, the multiple address control signal MUL_ADD_CON is disabled. If the multiple refresh signal REFP is enabled and the address control signal generator 150 is pulled down, the multiple address control signal MUL_ADD_CON is enabled. However, a logic AND operation between the target row refresh flag signal TRR_FLAG and each of the active signal ACTP and the multiple refresh signal REFP is performed, and the logic AND operation result is input to the address control signal generator 150. As a result, if the target row refresh flag signal TRR_FLAG is enabled, the multiple refresh signal REFP may be disabled.

By the above-mentioned structures, the refresh control device according to an embodiment of the present disclosure may increase refresh efficiency by simultaneously refreshing the plurality of word lines during a general refresh operation, and may reduce power consumption by refreshing only one word line during a target row refresh operation.

The final refresh address generator 160 may generate at least one final refresh address RES_RAX from the refresh addresses RAX<0:N> in response to the multiple address control signal MUL_ADD_CON.

In more detail, if the multiple address control signal MUL_ADD_CON is enabled, the final refresh address generator 160 may generate a plurality of final refresh addresses RES_RAX<0:N> based on the refresh addresses RAX<0:N>. In this case, the final refresh address generator 160 may determine and generate at least one upper bit of the refresh addresses RAX<0:N> to be in a "Don't care" state, resulting in an occurrence of the plurality of final refresh addresses RES_RAX<0:N>. For example, in order to generate the four final refresh addresses RES_RAX<0:N>, the final refresh address generator 160 may determine 2 bits corresponding to the N-th bit and the (N−1)-th bit of the refresh addresses RAX<0:N> to be in a "Don't care" state. That is, the final refresh address generator 160 may set the N-th bit and the (N−1)-th bit of the refresh addresses RAX<0:N> to each of "00", "01", "10", and "11", such that the four final refresh addresses RES_RAX<0:N> may be generated.

If the multiple address control signal MUL_ADD_CON is disabled, the final refresh address generator 160 may output the refresh addresses RAX<0:N> as a single final refresh address RES_RAX.

Figure 4:
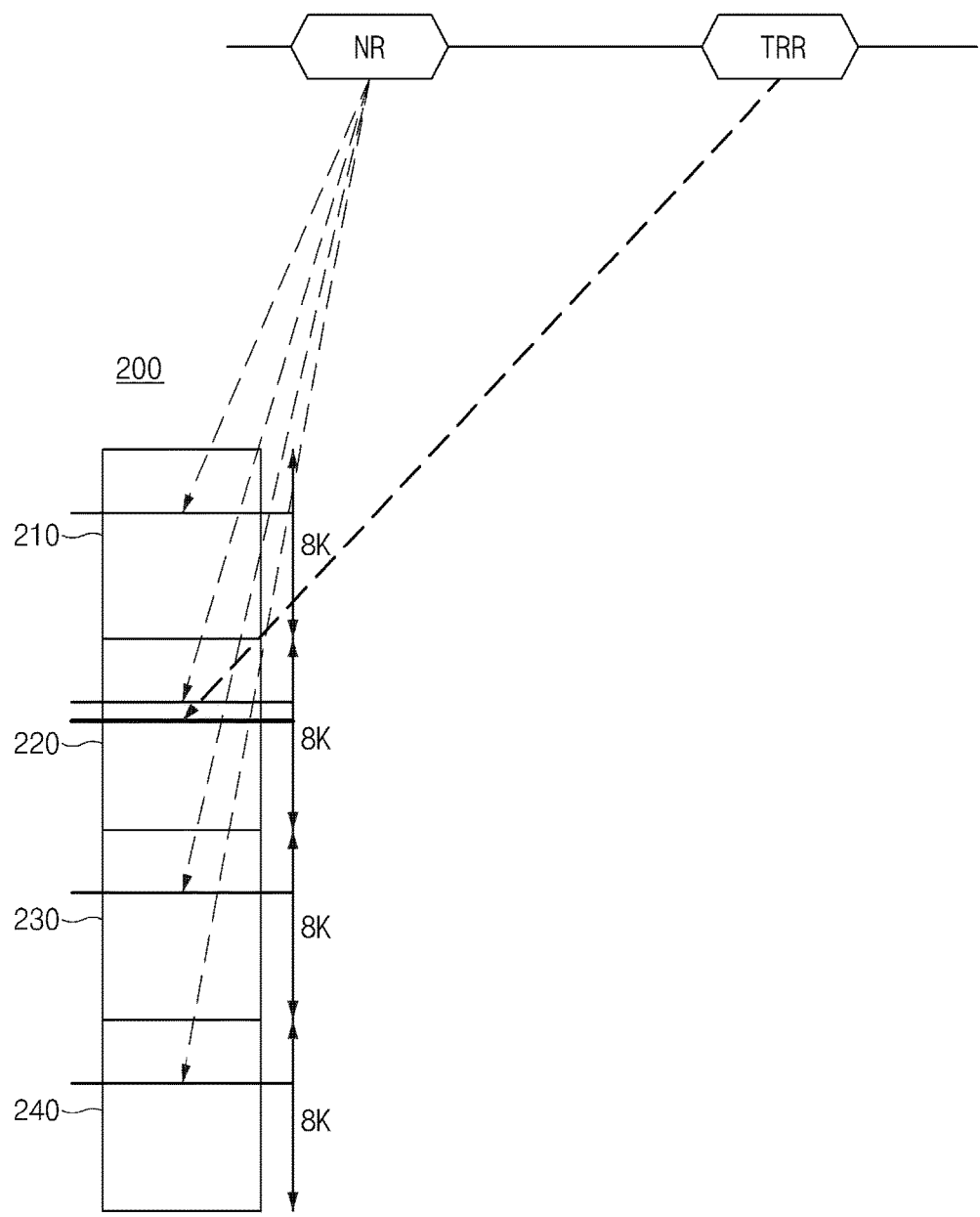
FIG. 4 is a conceptual diagram illustrating a representation of an example of a memory cell array according to an embodiment of the present disclosure.

FIG. 4 is a conceptual diagram illustrating a representation of an example of a memory cell array 200 according to an embodiment of the present disclosure.

Referring to FIG. 4, the memory cell array 200 may include a plurality of regions 210 to 240. Each of the regions 210 to 240 may include, for example, 8 k word lines.

During a normal refresh operation in which the target row refresh flag signal TRR_FLAG is disabled, the refresh control device 100 may refresh four word lines corresponding to the plurality of final refresh addresses RES_RAX. In this case, the four word lines may be contained in the regions 210, 220, 230, and 240, respectively.

In more detail, the address of the memory cell array 200 may sequentially increase in the direction from the upper end to the lower end of FIG. 4. The memory cell array 200 includes four regions 210, 220, 230, and 240, each of which includes 8 k word lines, resulting in implementation of 15-bit addresses. Here, two upper bits from among 15-bit addresses may represent the regions 210 to 240.

Therefore, if the multiple address control signal MUL_ADD_CON is enabled in the final refresh address generator 160 illustrated in FIG. 1, four final refresh addresses RES_RAX<0:N> generated when two upper bits are processed in the "Don't care" state may represent word lines located at the same position within the four regions 210 to 240.

During the target row refresh operation in which the target row refresh flag signal TRR_FLAG is enabled, the refresh control device 100 may refresh only one word line corresponding to the final refresh address RES_RAX<0:N>.

The embodiment of the present disclosure has disclosed that the memory cell array 200 includes four regions 210 to 240, and the final refresh address generator 160 processes two upper bits of the refresh addresses RAX in the "Don't care" state, resulting in the occurrence of four final refresh addresses. However, the scope or spirit of the present disclosure is not limited thereto, the number of regions contained in the memory cell array 200 and the number of refresh addresses contained in the memory cell array 200 may be appropriately established in consideration of refresh efficiency, power use, etc. For example, the memory cell array 200 may include 8 regions, the final refresh address generator 160 may process three upper bits of the refresh addresses RAX in the "Don't care" state, resulting in the occurrence of 8 final refresh addresses RES_RAX<0:N>.

Figure 5:
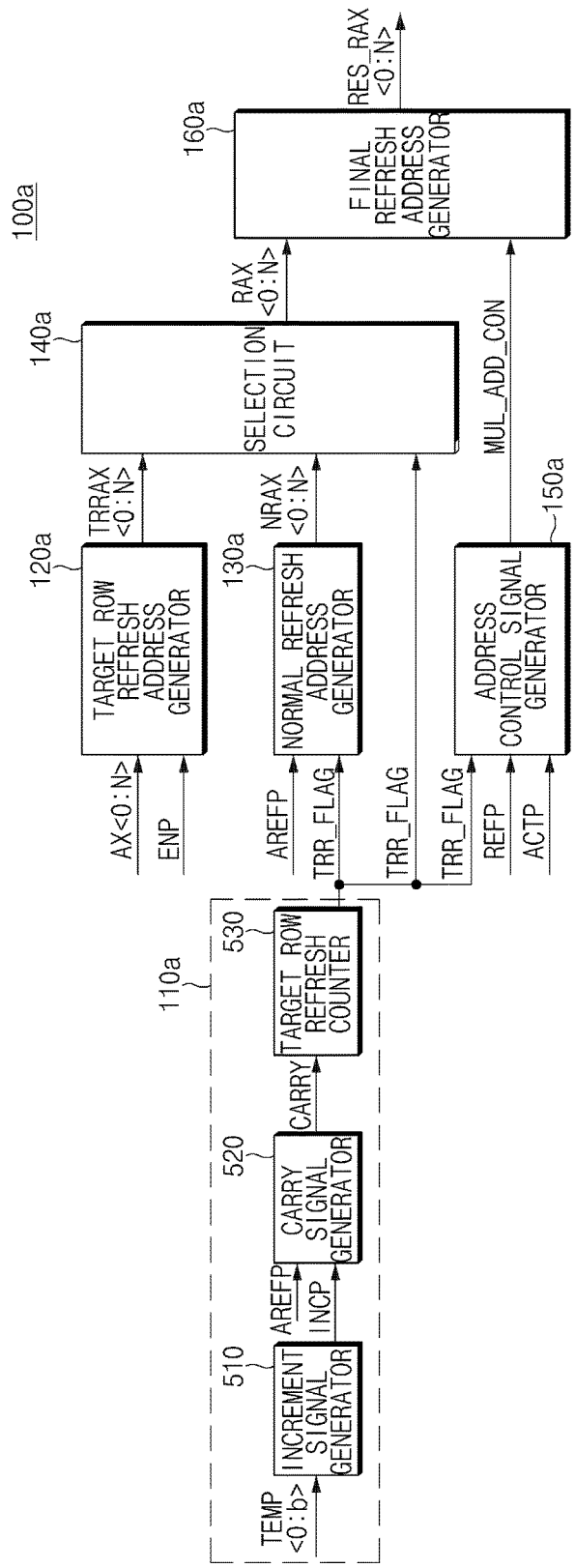
FIG. 5 is a block diagram illustrating a representation of an example of a refresh control device according to another embodiment of the present disclosure.

FIG. 5 is a block diagram illustrating a representation of an example of a refresh control device 100a according to another embodiment of the present disclosure.

Referring to FIG. 5, the refresh control device 100a may include a target row refresh flag generator 110a, a target row refresh address generator 120a, a normal refresh address generator 130a, a selection circuit 140a, an address control signal generator 150a, and a final refresh address generator 160a.

Unlike the refresh control device 100 illustrated in FIG. 1, temperature information TEMP<0:b> may be input to the refresh control device 100a illustrated in FIG. 5.

The target row refresh address generator 120a, the normal refresh address controller 130a, the selection circuit 140a, the address control signal generator 150a, and the final refresh address generator 160a illustrated in FIG. 5 may be substantially similar to the target row refresh address generator 120, the normal refresh address controller 130, the selection circuit 140, the address control signal generator 150, and the final refresh address generator 160 illustrated in FIG. 1.

The target row refresh flag generator 110a may adjust an enable period of the target row refresh flag signal TRR_FLAG according to an increment signal INCP generated based on at least one of temperature information TEMP<0:b> and an auto refresh signal AREFP.

In more detail, the target row refresh flag generator 110a may include an increment signal generator 510, a carry signal generator 520, and a target row refresh counter 530.

The increment signal generator 510 may generate the increment signal INCP based on a value of the temperature information TEMP<0:b>. In this case, the increment signal INCP may be formed in a pulse shape, and the increment signal generator 510 may control the number of times enable actions of the increment signal INCP to increase in proportion to the value of the temperature information TEMP<0:b>.

The carry signal generator 520 may generate a carry signal CARRY upon receiving at least one of the auto refresh signal AREFP and the increment signal INCP. In more detail, the carry signal generator 520 may generate the carry signal CARRY upon receiving the auto refresh signal AREFP or the increment signal INCP. The carry signal CARRY may be formed in a pulse shape.

The target row refresh counter 530 may generate the target row refresh flag signal TRR_FLAG based on the carry signal CARRY. In more detail, the target row refresh counter 530 may increase a counter value in response to the number of carry signals CARRY. Whenever the value of the counted carry signals CARRY reaches a predetermined value, the target row refresh counter 530 may enable the target row refresh flag signal.

Figure 6:
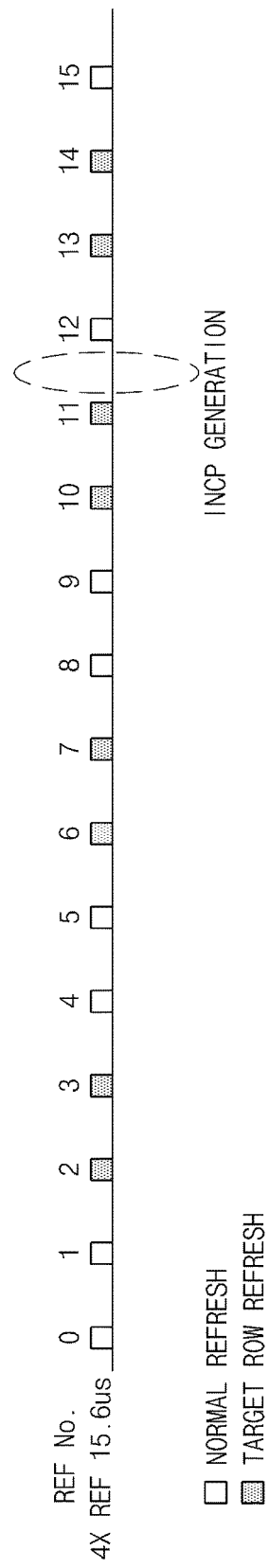
FIG. 6 is a timing diagram illustrating a representation of an example of a normal refresh operation and a target row refresh operation performed by the refresh control device shown in FIG. 5.

FIG. 6 is a timing diagram illustrating a representation of an example of a normal refresh operation and a target row refresh operation performed by the refresh control device 100a shown in FIG. 5.

In FIG. 6, it is assumed that the auto refresh signal AREFP is input at intervals of a predetermined time 15.6 μs.

Referring to FIG. 6, two normal refresh operations and two target row refresh operations may be alternately performed until the auto refresh signal AREFP is input eleven times. After a lapse of the 11$^{th}$ auto refresh signal AREFP, the increment signal INCP may occur based on the temperature information TEMP<0:b>. Therefore, the target row refresh counter 530 may rapidly reach a predetermined value. Thus, unless the increment signal INCP occurs, the target row refresh operation is performed when the 14$^{th}$ auto refresh signal AREFP is input. In contrast, as can be seen from FIG. 6, when the 13$^{th}$ auto refresh signal AREFP is input, the target row refresh operation is performed.

In accordance with an embodiment, a time period in which the target row refresh flag signal TRR_FLAG is enabled may be adjusted according to temperature information TEMP<0:b>. In other words, a ratio of the normal refresh operation to the target row refresh operation may be adjusted. Here, the normal refresh operation may be performed when the target row refresh flag signal TRR_FLAG is not enabled, and the target row refresh operation may be performed when the target row refresh flag signal TRR_FLAG is enabled.

As a result, the embodiments of the present disclosure may adjust the frequency of execution of a refresh operation of a word line corresponding to a target row refresh object according to temperature.

As is apparent from the above description, the refresh control device according to the embodiments of the present disclosure may reduce power during a target row refresh operation.

The refresh control device according to the embodiments of the present disclosure may adjust a time period of a target row refresh operation.

Those skilled in the art will appreciate that the disclosure may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalent range of the appended claims are intended to be embraced therein. In addition, it is obvious to those skilled in the art that claims that are not explicitly cited in each other in the appended claims may be presented in combination as an embodiment of the disclosure or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

Figure 7:
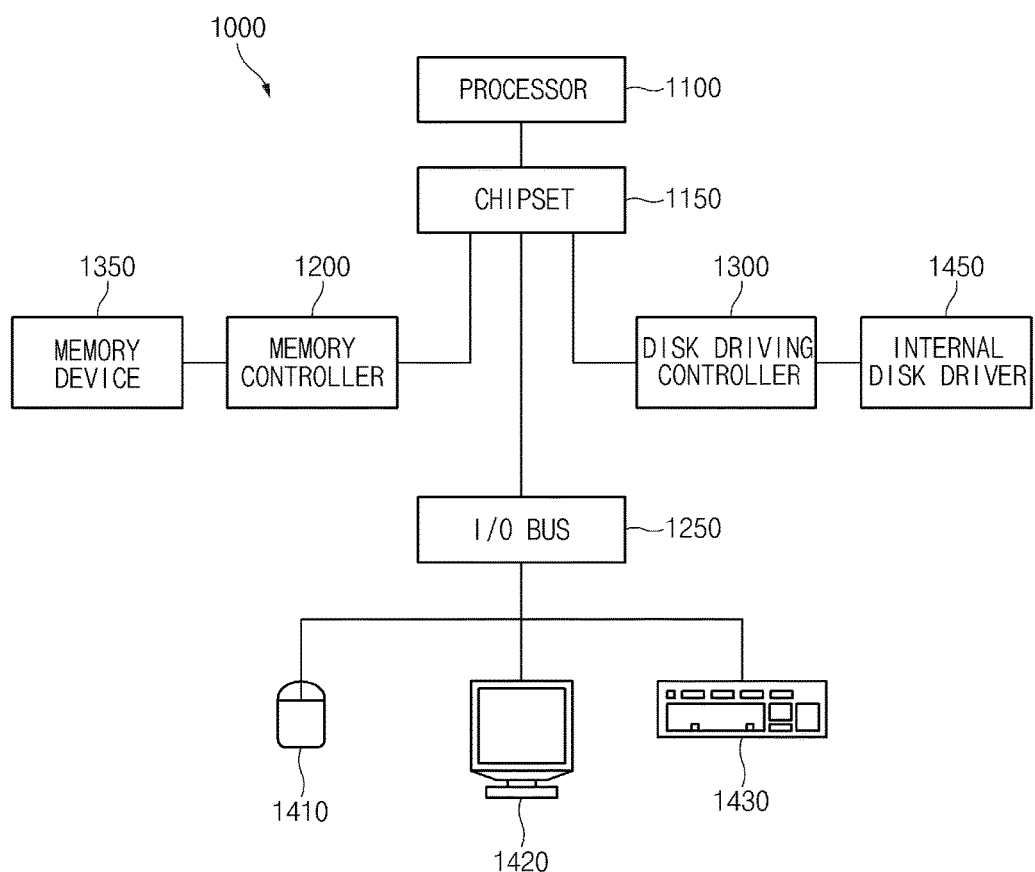
FIG. 7 illustrates a block diagram of an example representation of a system employing a refresh control device in accordance with the various embodiments discussed above with relation to FIGS. 1-6.

The semiconductor devices and/or a refresh control device 100 or 100a discussed above (see FIGS. 1-6) are particularly useful in the design of memory devices, processors, and computer systems. For example, referring to FIG. 7, a block diagram of a system employing a semiconductor device and/or a refresh control device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a refresh control device 100 or 100a as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or a refresh control device 100 or 100a as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor device and/or a refresh control device 100 or 100a as discussed above with relation to FIGS. 1-6. In alternate embodiments, such as, for example but not limited to, cellular phones or digital cameras, the components may differ from the embodiments illustrated in FIG. 7.

What is claimed is:

1. A refresh control device comprising:
   a refresh address generator configured to generate a refresh address by selecting any one of a target row refresh address and a normal refresh address according to a target row refresh flag signal;
   an address control signal generator configured to generate a multiple address control signal in response to the target row refresh flag signal and a multiple refresh signal, wherein the address control signal generator is configured to disable the multiple address control signal in response to the enabled target row refresh flag signal; and
   a final refresh address generator configured to generate a plurality of final refresh addresses from the refresh address in response to the multiple address control signal.

2. The refresh control device according to claim 1, wherein the address control signal generator is configured to enable the multiple address control signal in response to the enabled multiple refresh signal.

3. The refresh control device according to claim 1, wherein the address control signal generator is configured to disable the multiple address control signal upon receiving an active signal for a read operation or a write operation.

4. The refresh control device according to claim 1, further comprising:
a target row refresh flag generator configured to generate the target row refresh flag signal based on an auto refresh signal.

5. The refresh control device according to claim 4, wherein the target row refresh flag generator counts the auto refresh signal, and then enables the target row refresh flag signal when the counted number of auto refresh signals reaches a predetermined value.

6. The refresh control device according to claim 4, further comprising:
a normal refresh address generator configured to generate the normal refresh address based on the auto refresh signal and the target row refresh flag signal.

7. The refresh control device according to claim 6, wherein the normal refresh address generator is configured to generate the normal refresh address corresponding to a counted number of the auto refresh signals.

8. The refresh control device according to claim 7, wherein the normal refresh address generator does not count the number of auto refresh signals when the target row refresh flag signal is enabled.

9. The refresh control device according to claim 1, wherein the final refresh address generator is configured to generate the plurality of final refresh addresses by processing at least one upper bit of the refresh address in a "don't care" state.

10. The refresh control device according to claim 1, wherein the final refresh address generator is configured to generate a single final refresh address when the multiple address control signal is disabled.

11. The refresh control device according to claim 1, wherein:
the refresh address generator outputs the target row refresh address as the refresh address when the target row refresh flag signal is enabled; and
the refresh address generator outputs the normal refresh address as the refresh address when the target row refresh flag signal is disabled.

12. A refresh control device comprising:
a target row refresh flag generator configured to generate a target row refresh flag signal based on temperature information and an auto refresh signal;
a normal refresh address generator configured to generate a normal refresh address based on the auto refresh signal and the target row refresh flag signal; and
a refresh address generator configured to generate a refresh address by selecting any one of a target row refresh address and the normal refresh address according to the target row refresh flag signal.

13. The refresh control device according to claim 12, wherein the target row refresh flag generator includes:
an increment signal generator configured to generate an increment signal according to a value of the temperature information;
a carry signal generator configured to generate a carry signal upon receiving the auto refresh signal or the increment signal; and
a target row refresh counter configured to increase a counter value in response to the carry signal, and enable the target row refresh flag signal when the counter value reaches a predetermined value.

14. The refresh control device according to claim 13, wherein the increment signal generator is configured to control the number of times enable actions of the increment signal to increase in proportion to the value of the temperature information.

15. The refresh control device according to claim 12, further comprising:
an address control signal generator configured to generate a multiple address control signal in response to the target row refresh flag signal and a multiple refresh signal; and
a final refresh address generator configured to generate a plurality of final refresh addresses from the refresh address in response to the multiple address control signal.

16. The refresh control device according to claim 15, wherein the address control signal generator is configured to disable the multiple address control signal when the target row refresh flag signal is enabled.

17. The refresh control device according to claim 16, wherein the address control signal generator is configured to enable the multiple address control signal when the multiple refresh signal is enabled.

18. The refresh control device according to claim 16, wherein the address control signal generator is configured to disable the multiple address control signal upon receiving an active signal for a read operation or a write operation.

19. The refresh control device according to claim 15, wherein the final refresh address generator is configured to generate a single final refresh address when the multiple address control signal is disabled.

20. A refresh control device comprising:
a refresh address generator configured to generate a refresh address by selecting any one of a target row refresh address and a normal refresh address according to a target row refresh flag signal;
an address control signal generator configured to generate a multiple address control signal in response to the target row refresh flag signal and a multiple refresh signal; and
a final refresh address generator configured to generate a plurality of final refresh addresses from the refresh address in response to the multiple address control signal,
wherein the address control signal generator is configured to disable the multiple address control signal upon receiving an active signal for a read operation or a write operation.

* * * * *